United States Patent [19]

Bremer et al.

[11] Patent Number: 4,809,153
[45] Date of Patent: Feb. 28, 1989

[54] LOW-INDUCTANCE BUS BAR ARRANGEMENT

[75] Inventors: Jürgen Bremer; Andreas Fuchs; Rainer Marquardt, all of Erlangen, Fed. Rep. of Germany

[73] Assignee: Siemens Aktiengesellschaft, Berlin and Munich, Fed. Rep. of Germany

[21] Appl. No.: 19,048

[22] Filed: Feb. 26, 1987

[30] Foreign Application Priority Data

Mar. 18, 1986 [DE] Fed. Rep. of Germany ....... 3609065

[51] Int. Cl.$^4$ ............................................. H02M 1/00
[52] U.S. Cl. .................................. 363/141; 361/341; 361/361; 361/380; 363/144
[58] Field of Search .................. 174/32; 307/147, 148; 333/238; 361/341, 356, 361, 386–388; 363/141, 144

[56] References Cited

U.S. PATENT DOCUMENTS

| | | | |
|---|---|---|---|
| 2,439,471 | 4/1948 | Jackson | 174/32 |
| 2,810,892 | 10/1957 | Blitz | 333/238 |
| 3,091,655 | 5/1963 | Ruiter | 174/32 |
| 4,603,345 | 7/1986 | Lee et al. | 361/386 |

FOREIGN PATENT DOCUMENTS

| | | |
|---|---|---|
| 0166968 | 8/1986 | European Pat. Off. . |
| 0088924 | 9/1983 | Fed. Rep. of Germany . |
| 3336979 | 4/1984 | Fed. Rep. of Germany . |
| 3420535 | 5/1985 | Fed. Rep. of Germany . |
| 2201612 | 10/1972 | France . |
| 2217802 | 2/1974 | France . |
| 2224969 | 4/1974 | France . |

OTHER PUBLICATIONS

Japanese Patent Abstract, vol. 8, No. 277, Dec. 18, 1984, Appln. No. 58-18920.

Primary Examiner—Roy N. Envall, Jr.
Assistant Examiner—Gregory D. Thompson
Attorney, Agent, or Firm—Kenyon & Kenyon

[57] ABSTRACT

A low-inductance bus bar arrangement includes at least n+1 individual bus bars for establishing a quick connection of modular components of n dependent circuits. The n+1 individual bus bars are stacked upon each other and are electrically separated from each other by insulation. The two outermost bus bars are electrically connected to each other by an appropriate connecting device. While the several modular components of the n dependent circuits are quickly connectable to the bus bar, the bus bar itself provides an inherently low inductance.

1 Claim, 2 Drawing Sheets

LOW-INDUCTANCE BUS BAR ARRANGEMENT

BACKGROUND OF THE INVENTION

The present invention relates to the field of power bus bar arrangements and, more particularly, to a modular quick connect bus bar arrangement with several stacked bus bars electrically separated from each other by insulation.

From German Offenlegungschrift No. 34 20 535 A1, a module for a quick connect circuit arrangement with a parallel circuit of an active semiconductor switching element and a diode is known. The active semiconductor switching element and the diode are arranged in the immediate vicinity of each other and carry current in the same direction with respect to a load point. The active semiconductor switching element and the diode each are components of one circuit. A second parallel circuit is dependent on the parallel semiconductor circuit because of a common component. The terminals for the supply voltage and the common component are designed as three stacked conductor layers which are electrically separated from each other by insulation and are arranged in the immediate vicinity of each other and carry current in the same direction with respect to a load point. Thus, undesired voltage spikes during the switching operation are suppressed or attenuated. It is desirable, however, to reduce the inherent inductance of such modular quick connect arrangements.

SUMMARY OF THE INVENTION

The problem and related problems of prior art quick connect bus bar arrangements are solved by providing, in the case of n dependent circuits, at least n+1 bus bars which connect components of the circuits to each other, the two outermost bus bars being connected to each other in an electrically conducting manner.

In the low-inductance bus bar arrangement according to the invention, n +1 bus bars are stacked up for n dependent circuits of a quick connect circuit arrangement and are electrically separated from each other by insulation, and the outermost bus bars are electrically connected to each other directly. Thereby, each of the n circuits contains a double bar of closely adjacent bus bars which connect each of the corresponding components of the circuits, the spacing between the bars of each double bus bar being the same. The natural inductance of each double bus bar can be reduced as desired by widening the bus bars for a given spacing of insulation between bars and a given length for the bus bars. Thus, a bus bar arrangement with n+1 bus bars for a quick connect circuit arrangement is obtained, consisting of n dependent circuits, the natural inductance of which is greatly reduced. Due to the fact that the outermost bus bars have the same potential, the mechanical design of the circuit arrangement and the required insulation is also simplified.

DETAILED DESCRIPTION

Figure 1:
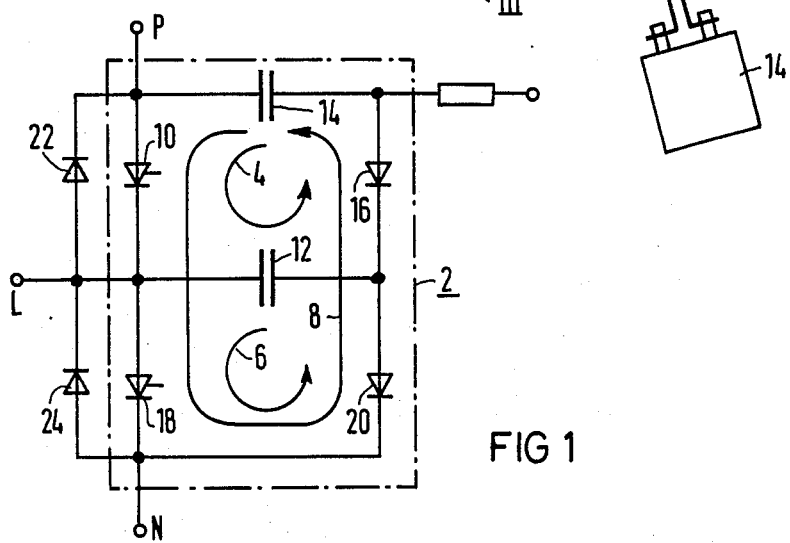
FIG. 1 is a schematic diagram of a quick connect circuit arrangement according to the present invention with three dependent circuits.
Figure 3:
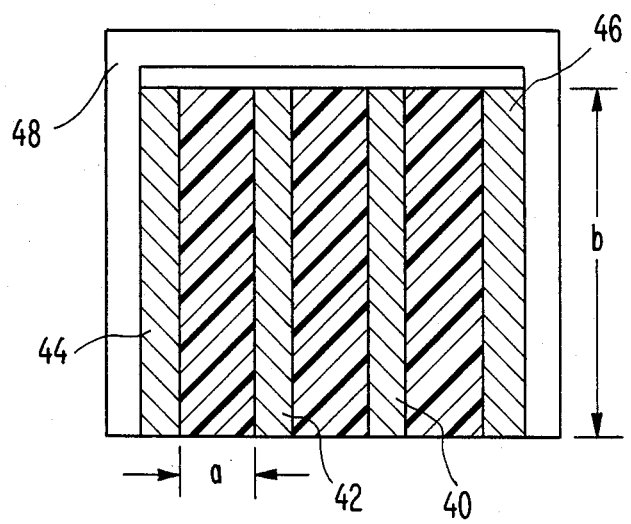
FIG. 3 shows a somewhat enlarged cross-sectional view taken along line III—III in FIG. 2.

In FIG. 1, a quick connect circuit arrangement 2, for instance, a phase building block of an inverter is shown which includes three dependent circuits 4, 6 and 8, i.e., circuits which share some of their components. The individual circuits 4, 6 and 8 are connected to each other via one or more corresponding components. The first circuit 4 contains an active semiconductor switching element 10, for instance, a thyristor, especially a GTO thyristor (gate-turn-off thyristor), two capacitors 12 and 14, and a diode 16. The capacitors 12 and 14 and the diode 16 are external wiring components in the same circuit 4 With the active semiconductor switching element 10. The second circuit 6 contains an active semiconductor switching element 18, a diode 20 and the capacitor 12. A thyristor or also a GTO thyristor can be provided as the active semiconductor switching element 18. The third circuit 8 contains the two active semiconductor switching elements 10 and 18, the two diodes 16 and 20 and the capacitor 14. In addition, the two active semiconductor switching elements 10 and 18 are each provided with a bypass diode 22 or 24 respectively which are each connected antiparallel to the active semiconductor switching elements 10 and 18. This circuit arrangement 2, for instance, a phase building block of a four quadrant inverter is connected by means of the terminals P and N to the positive and negative poles respectively, for instance, of an intermediate d-c link which is not shown for reasons of clarity.

Figure 2:
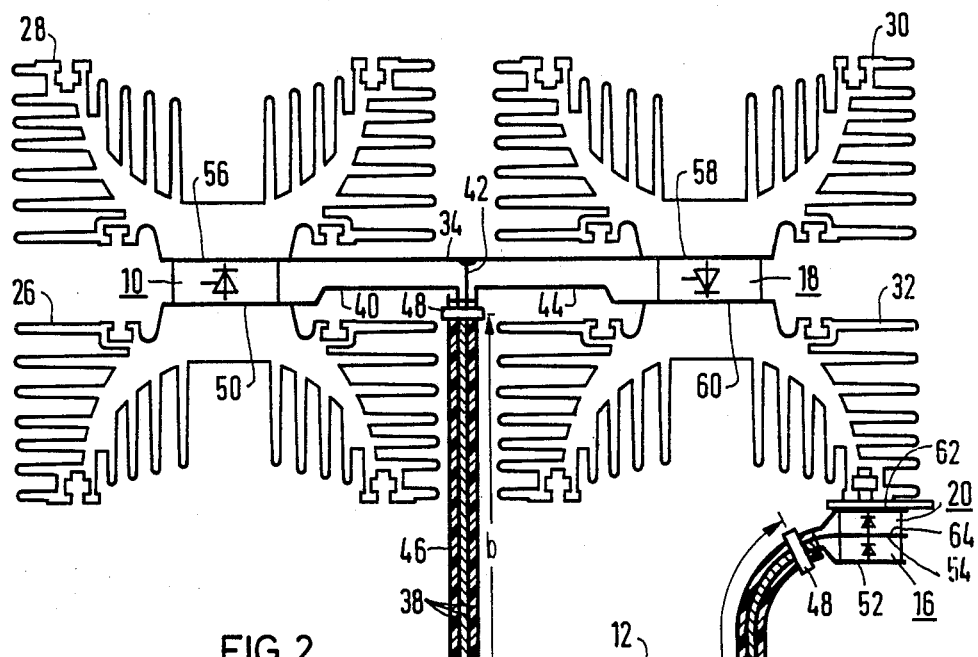
FIG. 2 illustrates the mechanical design of the circuit arrangement according to FIG. 1.

FIG. 2 illustrates the mechanical design of the circuit arrangement 2 according to FIG. 1. The active semiconductor switching elements 10 and 18 are arranged between pairs of heat sinks 26, 28 and 30, 32 respectively. The heat sinks 28 and 30 have the same potential, namely, the potential of the terminal L of the circuit arrangement 2 of FIG. 1. The cathode of the active semiconductor component 10 is connected by means of a bus bar 34 to the anode of the active semiconductor switching element 18. The potential of the heat sink 26 corresponds to the potential of the terminal P of the circuit arrangement 2 according to FIG. 1 and the potential of the heat sink 32 corresponds to the potential of the terminal N of the circuit arrangement 2. In order to facilitate quick connection of the active semiconductor switching elements 10 and 18 with the external wiring elements of the circuit arrangement 2 of FIG. 1, a bus bar arrangement 36 is provided. For the bus bar arrangement 36, several stacked bus bars 40, 42, 44 and 46 are provided which are electrically separated from each other by insulation 38. In the case of n circuits dependent on each other, at least n+1 bus bars are provided. According to FIG. 1, the circuit arrangements 2 includes three dependent circuits 4, 6, and 8. Accordingly, the bus bar arrangement 36 contains four stacked bus bars 40, 42, 44 and 46 which are electrically separated from each other by insulation 38. The two outermost bus bars 44 and 46 are connected to each other in an electrically conducting manner by means of a device 48. For the device 48, an electrically conducting loop may be provided which is connected in an electrically conducting manner only to the outer bus bars 44 and 46.

The bus bar 40 connects the anode terminal 50 of the active semiconductor switching element 10 and via capacitor 14 to the anode terminal 52 of the diode 16. The cathode terminal 54 of this diode 16 is connected by means of the bus bar 42 via the capacitor 12 to the cathode terminal 56 of the active semiconductor switching element 10 and to the anode terminal 58 of the active semiconductor switching element 18. Both bus bars 40 and 42 run approximately parallel and closely adjacent to each other and are separated electrically from each other by the insulation 38. If the width of each bus bar of, for example, the double bus bar comprising bus bars 40 and 42 is denoted b, the length 1, and the insulation spacing a, then the natural inductance of this double bus bar is determined by the width b of the bus bar if the length 1 of the bus bar and the insulation spacing a are given. It is known that the natural inductance of a double bar is approximately proportional to $1 \times a/b$. Thus, a reduction of the natural inductance of the double bar can be achieved by increasing the width b of the bus bar. It is also known that the leakage paths between the two bus bars of a double bar can be increased if the spacing of their insulation 38 is larger than the width b of the bus bars.

According to the circuit arrangement 2, particularly of the circuit 6, the cathode terminal 60 of the active semiconductor switching element 18 is directly connected by means of the bus bar 44 to the cathode terminal 62 of the diode 20. Since the two cathode terminals 60 and 62 have the same potential, the diode 20 is attached to the heat sink 32. The anode terminal 64 of the diode 20 is connected by means of the bus bar 42 to the anode terminal 58 of the active semiconductor switching element 18 via the capacitor 12. Consequently, in this circuit 6, the bus bars 42 and 44 form another double bus bar, the bus bars 42 and 44 being likewise closely adjacent to each other and electrically separated from each other by the insulation 38.

According to the circuit 8 of FIG. 1, the cathode terminal 56 of the active semiconductor switching element 10 is connected by means of the bus bar 34 to the anode terminal 58 of the active semiconductor switching element 18. The cathode terminal 60 of this active semiconductor switching element 18 is connected by means of the bus bar 44 to the cathode terminal 62 of the diode 20, the anode terminal 64 of which is connected indirectly to the cathode terminal 54 of the diode 16. The anode terminal 52 of this diode 16 is connected by means of the bus bar 40 via the capacitor 14 to the anode terminal 50 of the active semiconductor switching element 10. Thus, the bus bars 40 and 44 likewise form a double bus bar. In the center between the two bus bars 40 and 44, the bus bar 42 is arranged. The bus bars 40, 42 and 44 are each separated from each other electrically by the insulation 38. Therefore, the spacing between the bus bars 40 and 44 of the double bar of the circuit 8 is twice as large as the spacing of the bus bars 40 and 44 of the double bar of the circuit 4 or the spacing of the bus bars 42 and 44 of the double bar of the circuit 6. Thereby, the natural inductance of this double bar of the circuit 8 is twice as large as the natural inductance of the double bar of the circuits 4 and 6, respectively. In order to give the double bar of the circuit 8 the same spacing as the double bar of the circuits 4 and 6, respectively, the fourth bus bar 46 is stacked upon the bus bar 40, the bus bars 40 and 46 being electrically separated from each other by insulation 38. In addition, as noted above, this fourth bus bar 46 is connected to the bus bar 44 in an electrically conducting manner by means of devices 48. Thereby, the geometric dimensions of the double bars for each circuit 4, 6 and 8 are the same, whereby the natural inductances of the individual double bars are the same. Thus, a bus bar arrangement 36 for a quick connect circuit arrangement 2 with several dependent circuits 4, 6 and 8 is obtained, the natural inductance of which is very low. Since the outer bus bars 44 and 46 of the bus bar arrangement 36 have the same potential, the mechanical design of the circuit arrangement 2 and the required insulation are simplified.

In an advantageous embodiment of the mechanical design of the circuit arrangement 2 according to FIG. 1, the active semiconductor switching elements 10 and 18 are arranged physically separated from the external wiring elements, namely, the capacitors 12 and 14 and the diodes 16 and 20 in such a manner that a straight bus bar arrangement 36 is provided as the connection. Thereby, the fabrication of bus bar arrangement 36 and the assembly of the circuit arrangement 2 are simplified. In addition, the bus bars 40, 42 and 44 can also be provided as cooling surfaces for the external wiring elements. It is further possible to use the bus bars 40, 42, 44 and 46 for supplying operating currents.

What is claimed is:

1. In a low-inductance bus bar arrangement (36) used as electrical connection of common components (10, 12, 14, 16, 18, 20) of individual circuits (4, 6, 8) of a circuit arrangement (2) having a modular design, particularly a phase component of a converter, wherein the bus bar arrangement (36) has a low-inductance and is comprised of several bus bars (40, 42, 44, 46) which are in a stacked relation to each other and are electrically separated by a means for insulating from each other, the improvement comprising in that for n individual circuits (4, 6, 8) at least n+1 bus bars (40, 42, 44, 46) are provided for connecting said common components (10, 12, 14, 16, 18, 20) to one another, said n+1 bus bars including two outer bus bars (44, 46) which are connected to each other in an electrically conducting manner to maintain substantially the same inductance between any two bus bars forming one of said n circuits.

* * * * *